(12) United States Patent
Braithwaite et al.

(10) Patent No.: US 8,809,835 B2
(45) Date of Patent: *Aug. 19, 2014

(54) RF CIRCUITS INCLUDING TRANSISTORS HAVING STRAINED MATERIAL LAYERS

(75) Inventors: Glyn Braithwaite, Dresdsen (DE); Richard Hammond, Harriseahhead (GB); Matthew T. Currie, Brookline, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/568,944

(22) Filed: Aug. 7, 2012

(65) Prior Publication Data

US 2012/0299120 A1 Nov. 29, 2012

Related U.S. Application Data

(63) Continuation of application No. 13/017,694, filed on Jan. 31, 2011, now Pat. No. 8,247,798, which is a continuation of application No. 12/767,671, filed on Apr. 26, 2010, now Pat. No. 7,906,776, which is a continuation of application No. 11/032,413, filed on Jan. 10, 2005, now Pat. No. 7,709,828, which is a continuation of application No. 10/253,361, filed on Sep. 24, 2002, now Pat. No. 6,933,518.

(60) Provisional application No. 60/324,329, filed on Sep. 24, 2001.

(51) Int. Cl.
*H01L 29/737* (2006.01)
*H01L 29/10* (2006.01)

(52) U.S. Cl.
CPC ........ *H01L 29/7378* (2013.01); *H01L 29/1054* (2013.01)
USPC ...................................... 257/24; 257/E29.193

(58) Field of Classification Search
CPC .......................... H01L 29/7378; H01L 29/1054
See application file for complete search history.

(56) References Cited

U.S. PATENT DOCUMENTS

| | | | | |
|---|---|---|---|---|
| 5,777,364 | A | * | 7/1998 | Crabbe et al. ................. 257/347 |
| 6,059,895 | A | * | 5/2000 | Chu et al. ..................... 148/33.1 |
| 6,281,758 | B1 | * | 8/2001 | Elsayed et al. ................... 331/16 |
| 7,906,776 | B2 | * | 3/2011 | Braithwaite et al. ............ 257/24 |
| 8,247,798 | B2 | * | 8/2012 | Braithwaite et al. ............ 257/24 |
| 2002/0014660 | A1 | * | 2/2002 | Noble et al. ................... 257/346 |
| 2002/0017644 | A1 | * | 2/2002 | Fitzgerald ....................... 257/69 |

OTHER PUBLICATIONS

Streetman, B. G., et al., "Solid State Electronic Devices," 2000, 8 pages, Fifth Edition, Prentice Hall, Upper Saddle River, New Jersey.

* cited by examiner

*Primary Examiner* — Benjamin Sandvik
(74) *Attorney, Agent, or Firm* — Slater and Matsil, L.L.P.

(57) ABSTRACT

Circuits for processing radio frequency ("RF") and microwave signals are fabricated using field effect transistors ("FETs") that have one or more strained channel layers disposed on one or more planarized substrate layers. FETs having such a configuration exhibit improved values for, for example, transconductance and noise figure. RF circuits such as, for example, voltage controlled oscillators ("VCOs"), low noise amplifiers ("LNAs"), and phase locked loops ("PLLs") built using these FETs also exhibit enhanced performance.

19 Claims, 7 Drawing Sheets ously have a lower resistivity compared to GaAs substrates. This generally causes greater signal losses in Si compared to GaAs. This, in turn, typically results in increased power consumption in the GHz regime for Si-based devices, and lower quality ("Q") factors for passive Si-based components, the latter of which degrades the noise performance.

RF CIRCUITS INCLUDING TRANSISTORS HAVING STRAINED MATERIAL LAYERS

This application is a continuation of U.S. patent application Ser. No. 13/017,694, filed Jan. 31, 2011, which is a continuation of U.S. patent application Ser. No. 12/767,671, filed Apr. 26, 2010, now U.S. Pat. No. 7,906,776, which is a continuation of U.S. patent application Ser. No. 11/032,413, filed Jan. 10, 2005, now U.S. Pat. No. 7,709,828, which is a continuation of U.S. patent application Ser. No. 10/253,361, filed Sep. 24, 2002, now U.S. Pat. No. 6,933,518, which claims priority to and the benefit of U.S. Provisional Patent Application Ser. No. 60/324,329, filed Sep. 24, 2001; each of these applications are incorporated herein by reference in their entireties.

TECHNICAL FIELD

The present invention relates generally to circuits that process radio frequency (hereinafter, "RF") and microwave signals and, more specifically, to RF circuits that contain transistors, including field effect transistors (hereinafter, "FETs" or "MOSFETs") that incorporate one or more strained material layers.

BACKGROUND

Continuous improvements in semiconductor process technology have extended the capability of silicon ("Si") CMOS devices into the RF and microwave domain. Improvements resulting in, for example, smaller FET gate lengths have increased the maximum frequency of operation. There has been long-standing interest in increasing the frequency capability of Si for many reasons, including the generally lower cost of Si-based devices compared to III-V devices, such as, for example, those fabricated from gallium arsenide ("GaAs") and indium phosphide ("InP"). Furthermore, given the overall maturity of Si process technology, mixed signal devices (i.e., devices that process both analog and digital signals on the same semiconductor chip), are generally more easily fabricated in Si than in other materials. Other advantages of Si include greater surface smoothness and a high thermal conductivity (approximately three times that of GaAs). Si also has a high dielectric constant that is generally unaffected by variations in temperature, or frequency, or both.

On the other hand, the intrinsic peak mobility of electrons in Si is approximately 600 cm$^2$V$^{-1}$s$^{-1}$. This is lower than the electron mobility of 8500 cm$^2$V$^{-1}$s$^{-1}$ in GaAs. Accordingly, for Si-based devices to have performance (per unit gate width) that is substantially equivalent to GaAs-based devices, Si gate lengths must be scaled downward significantly. For example, NMOS devices have been demonstrated that have cutoff frequencies between 120 GHz and 150 GHz, with effective electrical gate lengths on the order of 0.09 micrometer.

A problem with such significant downward scaling of gate length is that doing so affects the noise performance of the resulting device. Although long channel devices have been demonstrated that have a noise figure of approximately 1-2 dB, as gate lengths decrease, short channel (e.g., "shot") noise typically begins to degrade device performance. Adding one or more bipolar structures to the CMOS semiconductor chip (resulting in a "BiCMOS" design) can circumvent this problem. Nevertheless, a BiCMOS structure adds several steps to the CMOS fabrication process, thereby increasing production complexity and cost.

The Si substrates used in the fabrication of RF devices typically have a lower resistivity compared to GaAs substrates. This generally causes greater signal losses in Si compared to GaAs. This, in turn, typically results in increased power consumption in the GHz regime for Si-based devices, and lower quality ("Q") factors for passive Si-based components, the latter of which degrades the noise performance.

RF circuits, such as voltage controlled oscillators ("VCOs"), low noise amplifiers ("LNAs"), and phase locked loops ("PLLs"), typically include one or more transistors. When operated at high frequency, these circuits can suffer from poor performance like that described above due, at least in part, to their use of one or more conventional transistors in the overall circuit designs. Converting such designs to GaAs or BiCMOS can be problematic, particularly when a circuit is monolithic (i.e., when the most or all of the circuit is contained on one semiconductor chip). The increase in cost and complexity of such a conversion can make it impractical or impossible.

From the foregoing, it is apparent that there is still a need for a way to improve the performance of RF circuits, particularly at high frequencies, while avoiding changes to the circuit designs or fabrication sequences that can increase cost and complexity.

SUMMARY

The present invention provides circuits for processing RF signals that exhibit improved performance without requiring significant changes to design or fabrication. This is accomplished by including in the circuits devices (either active, or passive, or both) having enhanced material properties, such as, for example, increased electron and hole mobilities. Consequently, these devices exhibit superior performance that, in turn, influences overall circuit operation.

The invention features a circuit that includes one or more FETs to which an RF signal is applied. In different embodiments, the circuit can include one or more of a voltage controlled oscillator, a low noise amplifier, or phase locked loop. The FETs are fabricated in a semiconductor substrate that includes at least one planarized layer. The channel regions of these FETs include one or more strained material layers disposed on a planarized layer.

In certain embodiments, the semiconductor substrate can include Si, SiGe, or any combination of these materials. It can also be multi-layered. In this latter case, the layers can include relaxed SiGe disposed on compositionally graded SiGe. The layers can also include relaxed SiGe disposed on Si. One or more buried insulating layers may be included as well.

In other embodiments, the strained layer can include Si, Ge, SiGe, or any combination of these materials. At least about fifty Angstroms of the strained layer farthest from the planarized layer defines a distal zone where an impurity gradient (describing the concentration of one or more impurities (i.e., dopants) as a function of location in the device) has a value that is substantially equal to zero.

Other aspects and advantages of the present invention will become apparent from the following detailed description, taken in conjunction with the accompanying drawings, illustrating the principles of the invention by way of example only.

BRIEF DESCRIPTION OF THE FIGURES

The foregoing and other objects, features, and advantages of the present invention, as well as the invention itself, will be more fully understood from the following description of various embodiments, when read together with the accompanying drawings, in which.

DETAILED DESCRIPTION

Figure 1:
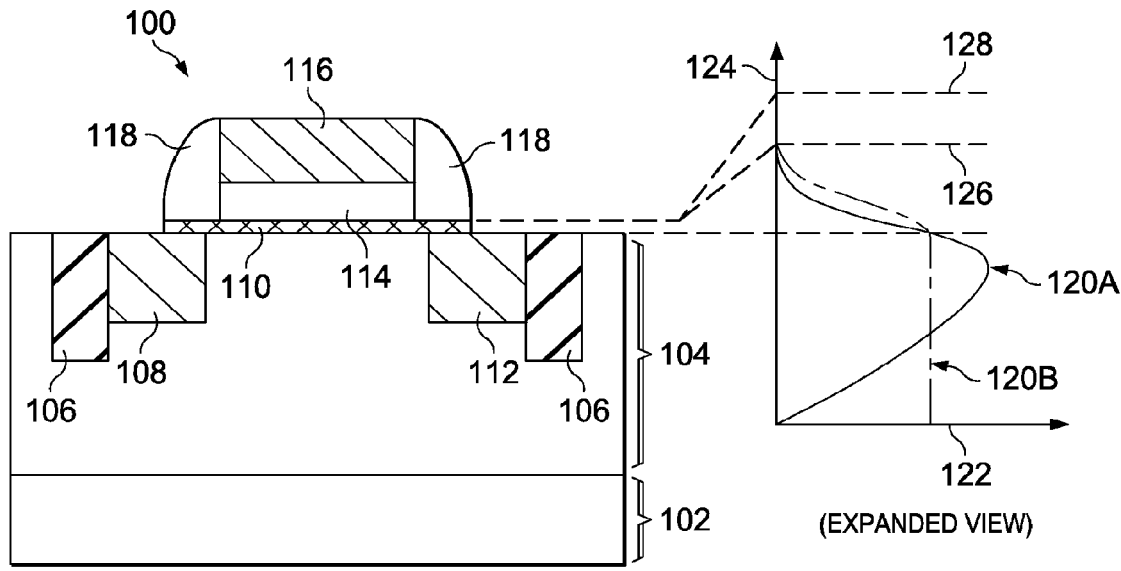
FIG. 1 is a schematic (unscaled) cross-sectional view that depicts a FET in accordance with an embodiment of the invention.

As shown in the drawings for the purposes of illustration, the invention may be embodied in a circuit, such as, for example, a voltage controlled oscillator, low noise amplifier, or a phase locked loop, for processing an RF signal. The circuit includes at least one FET fabricated in a semiconductor a substrate that has at least one planarized layer and one or more strained material layers disposed on the planarized layer. Consequently, the FET, and the circuit, exhibit improved performance, particularly at high signal frequencies. In some embodiments, the strained material layers may be characterized by at least one diffusion impurity gradient that has a value that is substantially equal to zero in a particular area of the strained layer.

Technical Background

When Si is placed under tension, the degeneracy of the conduction band splits, forcing two valleys to be occupied instead of six. Consequently, the in-plane mobility is increased, reaching a value as high as 2900 cm$^2$V$^{-1}$ s$^{-1}$ in buried channel devices for electron densities of $10^{11}$-$10^{12}$ cm$^{-2}$. Mobility enhancement can be incorporated into a MOS device by disposing a compositionally graded buffer layer between a SiGe film and the Si substrate. The grading spreads the lattice mismatch within the buffer over a distance, thereby minimizing the number of lattice dislocations reaching the surface on which the film is disposed, and thus providing a method for growing high-quality relaxed SiGe films on Si. Typically, a Si film having a thickness is grown on the relaxed SiGe film. Since the lattice constant of SiGe is larger than that of Si, the Si film is under biaxial tension, causing the carriers to exhibit strain-enhanced mobilities.

Unlike many GaAs high mobility technologies, strained Si devices generally can be fabricated with standard Si CMOS processing methods and tools. This compatibility generally allows for performance enhancement with minimal additional capital expenditures. The technology is also scalable and thus can be implemented in both long and short channel devices. Furthermore, if desired, strained Si can be incorporated with Si-on-insulator ("SOI") technology in order to provide ultra-high speed and low power circuits. In summary, since strained Si technology is similar to bulk Si technology, it is not exclusive to other performance enhancing methods. Consequently, strained Si is well-suited to improve the performance of CMOS-based microwave circuits.

The strained Si material system can improve microwave circuit performance several ways. Example categories include:

1. Circuit and Device Performance—Gain and Noise.
   a. For RF circuits, the increased mobility improves the device gain compared to CMOS-based designs.
   b. Enhanced mobility lowers the minimum noise figure on buried channel or surface channel devices. This is applicable to, for example, LNAs, VCOs, and PLLs.
   c. Use of buried or surface channel devices having improved mobility and increased effective mass perpendicular to the oxide interface (i.e., perpendicular to the direction of current flow) lowers flicker noise, thereby enabling higher performance RF circuits (e.g., VCOs and PLLs).
2. Ease of Fabrication.
   a. Substrate planarization and re-growth facilitates photolithography and fabrication of surface or buried channel strained Si layer devices on substrates containing up to, for example, 30% Ge.
   b. Substrate planarization and re-growth for higher Ge concentration enables the photolithographically defined, higher performance modulation doped FETs ("MODFETs") for RF circuits (by virtue of increased hetero-confinement).
   c. A digital component may be integrated easily with the RF circuit.
3. Passive Components—Ease of Fabrication, Q-Factor and Noise Enhancement.
   a. Because of implant control for buried channel devices (compared with grown modulation doped structures), there is generally no need to etch away or counter dope one or more epilayers (possibly causing irrecoverable damage, negating the need for additional reconstruction or passivation).
   b. Because of planarized substrates, there is greater control of defect densities and material quality of the epilayers. There is also greater control (typically by ion implantation) of the substrate contact and doping allowing fabrication of low electrical resistance regions (for ground planes or contacts), and regions of high electrical resistance that enable fabrication of passive components of higher Q and lower noise.
   c. A high quality oxide may be grown for varactors having a high Q factor.

Strained Si Mobility Enhancement

Typically, a Si channel in a FET is placed under biaxial tension by the underlying, larger-lattice-constant SiGe layer. This strain causes the conduction band to split into two-fold four-fold degenerate bands. The two-fold band is preferentially occupied since it sits at a lower energy. The energy separation between the bands is approximately:

$$\Delta E_{strain} = 0.67 \times [eV] \qquad \text{(Equation 1)}$$

where "x" is equal to the Ge content in the SiGe layer. Equation (1) shows that the band splitting increases as the Ge content increases. This splitting causes mobility enhancement (compared to unstrained material) typically by two mechanisms. First, the two-fold band has a lower effective mass, and thus higher mobility than the four-fold band. Therefore, as the higher mobility band becomes energetically preferred, the average carrier mobility increases. Second, since the carriers are occupying two orbitals instead of six, inter-valley phonon scattering is reduced, further enhancing the carrier mobility.

At a concentration of 20% Ge, the electron mobility enhancement at high fields (0.2~0.7 MV/cm) is approximately 1.75 that of unstrained material, while the hole mobility enhancement is generally negligible. When the Ge concentration is increased to 30%, the electron mobility enhancement improves slightly to 1.8 and the hole mobility enhancement rises to about 1.4. Above 30% Ge, the band splitting is large enough that almost all of the carriers occupy the high mobility band. As a result, mobility enhancement as a function of Ge concentration saturates above about 30% Ge. Because of the low hole mobility, higher mobility, buried P-channel MOSFETs may offer an improved alternative.

Drain Current Enhancement

FETs fabricated using one or more strained Si layers have, for a given source-drain bias, greater drain current compared to FETs fabricated using unstrained Si layers. FET transconductance is defined by:

$$g_m \equiv \frac{\partial I_D}{\partial V_G}\bigg|_{V_D} \qquad \text{(Equation 2)}$$

where "$I_D$" is the drain current, "$V_G$" is the gate bias voltage, and "$V_D$" is the source-drain bias. Accordingly, the greater drain current results in an increased transconductance. Since transistor gain is generally directly proportional to transconductance, the former is also increased by the greater drain current.

By way of example, consider an n-channel MOSFET fabricated in 0.8 micron process technology using strained Si. The typical process affords low contact resistance. It also minimizes the amount of diffusion of Ge from the buffer layer into the strained material, particularly in at least about fifty Angstroms of the strained material distal to (e.g., farthest from) the buffer layer. This configuration maximizes the mobility increase in the surface strained layer.

This example MOSFET structure has, at about 100 mV source-drain bias, a transconductance approximately twice that of a 0.8 micron n-channel MOSFET fabricated without strained Si operating at the same bias point. At a source-drain bias of about 2.5 V, the FET with the strained Si has a transconductance approximately 1.4 that of the FET lacking the strained Si.

Given the proportional relationship between them, the transconductance also impacts the device cutoff frequency:

$$f_T \propto \frac{g_m}{C_{OX}} \qquad \text{(Equation 3)}$$

where "$C_{OX}$" is the FET gate capacitance. Since, for example, having a strained Si surface layer can double the transconductance, the cutoff frequency correspondingly doubles for a range of gate biases when compared to the FET without the strained Si.

Noise Figure Improvement

For discrete MOSFET devices, the noise figure at both high and low frequencies is a parameter that can affect the performance of RF and microwave circuits. Noise generally includes two components: flicker ("1/f") noise and "white noise" (noise that is generally independent of frequency). At low frequencies, flicker noise dominates, typically affecting the quality of circuits such as VCOs or PLLs. At higher frequencies, white noise dominates and typically affects the noise figure of LNAs.

With respect to flicker noise, using p-channel MOSFETs in place of n-channel MOSFETs will generally improve the performance of VCOs and PLLs. One reason for this effect is that free charge carriers in the inversion layer at the oxide-semiconductor interface quantum mechanically tunnel into traps within the oxide causing random fluctuations (and hence noise) in the drain current. The tunneling probability ("P") may be expressed as being exponentially dependent on the product of the barrier height ("AE") and transverse effective mass "$m_t^*$" (perpendicular to the oxide), that is:

$$P \propto e^{-\Delta E m_1^*} \qquad \text{(Equation 4)}$$

Given that the transverse effective mass for electrons (equal to 0.19 $m_0$, where $m_0$ is the electron rest mass) is less than that for (heavy) holes (0.49 $m_0$), equation (4) shows that the probability of (heavy) holes tunneling into traps in the oxide is significantly lower compared to electrons. Consequently, there is typically a reduction in 1/f noise in p-channel MOSFETs compared to n-channel MOSFETs, potentially as much as at least one order of magnitude. The reduced mobility of the holes relative to electrons further reduces the 1/f noise component.

In strained Si, the electron tunneling generally occurs along the axes of the constant energy surfaces, i.e., longitudinally along the symmetry axes. Accordingly, the tunneling effective mass for electrons is the longitudinal effective mass, "$m_1^*$", which is equal to 0.98 $m_0$. This is greater than the transverse effective mass for electrons (0.19 $m_0$), which applies in the case of tunneling in unstrained (i.e., bulk) Si.

The oxide-Si potential, barrier height for electrons in strained Si is approximately 2.5 eV and, for holes, it is approximately 5.0 eV. Multiplying each of these terms by the appropriate effective mass (0.98 $m_0$ and 0.49 $m_0$, respectively) yields about the same value. Consequently, the probability of electrons tunneling into traps within the oxide will be the same in a strained Si device as that for holes in a bulk Si device. Therefore, the 1/f noise component in strained surface n-channel MOSFETs approaches that of p-channel MOSFETs, thereby offering substantial improvement over n-channel MOSFETs fabricated in unstrained Si.

With respect to white noise, the minimum noise figure ("$NF_{min}$") at frequency "f" of a MOSFET or MODFET, assuming that thermal noise from parasitic resistances $R_{source}$ and $R_{gate}$ dominate, may be expressed as:

$$NF_{min} = 1 + \left(\frac{f}{f_T}\right) K_f \sqrt{g_m(R_{source} + R_{gate})} \qquad \text{(Equation 5)}$$

where "$K_f$" is a fitting factor. $K_f$, $R_{source}$, and $R_{gate}$ typically vary depending on the fabrication process and parasitic capacitance values. Nevertheless, by equation (3), the cutoff frequency is proportional to the transconductance, so increasing the latter will improve (decrease) the minimum noise figure of the device. In other words, by equations (3) and (5), the effect of increased transconductance and cutoff frequency will affect $NF_{min}$ by a value corresponding to $g_m^{-1/2}$.

By way of example, the following table (Table 1) shows some typical values for the mobility enhancement, transconductance, cutoff frequency, and minimum noise figure for various strained Si configurations (Ge percentages shown), normalized to bulk Si values:

TABLE 1

| Material Configuration | Mobility Enhancement | Transconductance (Gain) | Cutoff Frequency | Minimum Noise FIGURE |
|---|---|---|---|---|
| 20% NMOS | 1.75 | 1.75 | 1.75 | 0.76 |
| 30% NMOS | 1.8 | 1.8 | 1.8 | 0.75 |
| 20% PMOS | 1 | 1 | 1 | 1 |
| 30% PMOS | 1.4 | 1.4 | 1.4 | 0.85 |

The mobility enhancement leads to improvement in transconductance (i.e., gain) and cutoff frequency. The enhancement in noise figure can be difficult to predict, since the device geometry and process affect the values of parasitic contact resistances. Nevertheless, the reduction in the value of $g_m^{-1/2}$ typically results in a reduction in the noise figure for LNAs that include strained Si MOSFETs.

Buried Strained Channel Devices

The carrier mobility in a strained surface layer MOSFET can be improved by "burying" the strained layer. In this configuration, a SiGe "cap" layer having a thickness of about thirty to two hundred Angstroms is deposited on the strained layer (typically Si). An oxide (i.e., gate dielectric) is then deposited or grown on the cap layer, and the gate electrode is deposited on the oxide. Consequently, and unlike conventional Si MOSFETs, the gate dielectric layer is spatially separated (by the cap layer) from the active device channel (i.e., the strained layer). The corresponding conduction band offset allows two-dimensional carrier confinement within the strained Si quantum well.

The value of the electron mobility in such buried strained Si layers can reach 2900 cm$^2$V$^{-1}$s$^{-1}$. This is a substantial increase over the typical 600 cm$^2$V$^{-1}$s$^{-1}$ electron mobility in bulk Si MOSFETs.

The thickness of the oxide and cap layer generally affects the high frequency performance of the FET. By way of example, the following table (Table 2) shows some typical values for mobility enhancement, transconductance, cutoff frequency, and minimum noise figure (all normalized to bulk Si values) for various strained Si n-channel MOSFET configurations having different oxide and cap layer thicknesses:

TABLE 2

| Oxide Thickness [Angstroms] | Cap Layer Thickness [Angstroms] | Equivalent Oxide Thickness [Angstroms] | Mobility Enhancement | Trans-conductance (Gain) | Cutoff Frequency | Minimum Noise Figure |
|---|---|---|---|---|---|---|
| 50 | 50 | 66.7 | 4.3 | 3.2 | 3.2 | 0.56 |
| 50 | 100 | 83.3 | 4.3 | 2.5 | 2.5 | 0.63 |
| 30 | 50 | 46.7 | 4.3 | 2.8 | 2.8 | 0.59 |
| 30 | 100 | 63.3 | 4.3 | 2.0 | 2.0 | 0.71 |
| 15 | 50 | 31.7 | 4.3 | 2.0 | 2.0 | 0.71 |
| 15 | 100 | 48.3 | 4.3 | 1.3 | 1.3 | 0.87 |

The "equivalent oxide thickness" ("$T_{equivalent}$") approximates the combined effect of the oxide and cap layer thicknesses ("$T_{ox}$" and "$T_{cap}$", respectively), and is computed as follows:

$$T_{equivalent} = \varepsilon_{ox}\left(\frac{T_{ox}}{\varepsilon_{ox}} + \frac{T_{cap}}{\varepsilon_{cap}}\right) \quad \text{(Equation 6)}$$

where "$\varepsilon_{ox}$" and "$\varepsilon_{cap}$" are the permittivities of the oxide and cap layer, respectively.

As Table 2 shows, the values of mobility enhancement, transconductance, cutoff frequency, and minimum noise figure are improved compared to an n-channel MOSFET fabricated in bulk Si.

The spatial separation of charge carriers from the oxide interface by virtue of the cap layer also decreases 1/f noise, typically by about an order of magnitude. An example of this is seen in p-channel MOSFETs fabricated on buried channel pseudomorphic strained SiGe alloy layers. In these devices, the mobility is increased relative to bulk Si by a factor of about 1.5. Nevertheless, because the 1/f noise is an order of magnitude lower when compared with conventional p-channel MOSFETs, the implication is that the spatial separation of charges from the oxide interface dominates the magnitude of the 1/f noise. Consequently, spatial separation of carriers from the oxide interface in a buried strained layer structures further improves the 1/f noise component.

Example Device Structure

In one embodiment depicted schematically (i.e., unscaled) in FIG. 1, a FET 100 is fabricated in a semiconductor substrate 102, which may be Si, SiGe, or other compounds such as, for example, GaAs or InP. The substrate 102 can be multilayered, and it can include relaxed SiGe disposed on compositionally graded SiGe, or relaxed SiGe disposed on Si. One or more of these layers may be planarized, typically by chemical mechanical polishing ("CMP"). The substrate 102 may also include a buried insulating layer, such as SiO$_2$ or Si$_3$N$_4$. The buried insulating layer may also be doped.

Disposed on the substrate 102 is an isolation well 104, typically including an oxide. Within the isolation well 104 are isolation trenches 106. A source region 108 and a drain region 112 are typically formed by ion implantation. A FET channel 110, which can have either n-type or p-type conductivity, is formed from one or more strained layers. The strained layers can include one or more layers of Si, Ge, or SiGe. The "strain" in the strained layers may be compressive or tensile, and it may be induced by lattice mismatch with respect to an adjacent layer. Alternatively, the strain may be induced mechanically by, for example, the deposition of overlayers, such as Si$_3$N$_4$. Another way to induce mechanical strain is to create underlying voids by, for example, implantation of one or more gases followed by annealing. Both of these approaches induce strain in the underlying substrate 102, in turn causing strain in the channel 110.

Disposed on at least part of the channel 110 is a gate dielectric 114, such as, for example, SiO$_2$, Si$_3$N$_4$, or any other material with a dielectric constant greater than that of SiO$_2$ (e.g., HfO$_2$, HfSiON). The gate dielectric 114 is typically twelve to one hundred Angstroms thick, and it can include a stacked structure (e.g., thin SiO$_2$ capped with another material having a high dielectric constant).

Disposed on the gate dielectric 114 is the gate electrode 116. The gate electrode 116 material can include doped or undoped polysilicon, doped or undoped poly-SiGe, or metal. Disposed about the gate electrode 116 are the transistor spacers 118. The transistor spacers 118 are typically formed by depositing a dielectric material, which may be the same material as the gate dielectric 114, followed by anisotropic etching.

Figure 1A:
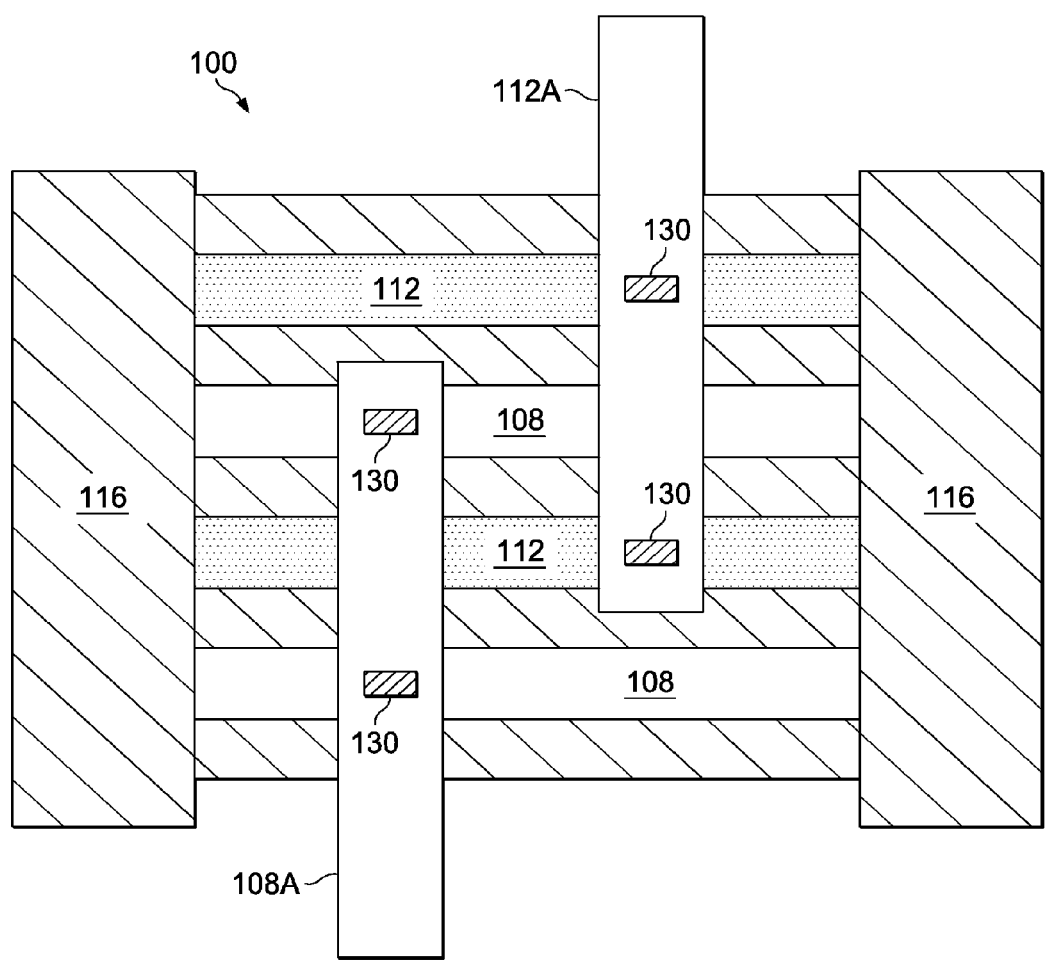
FIGS. 1A and 1B are schematic (unscaled) views that depict FETs in accordance with an embodiment of the invention.
Figure 1B:
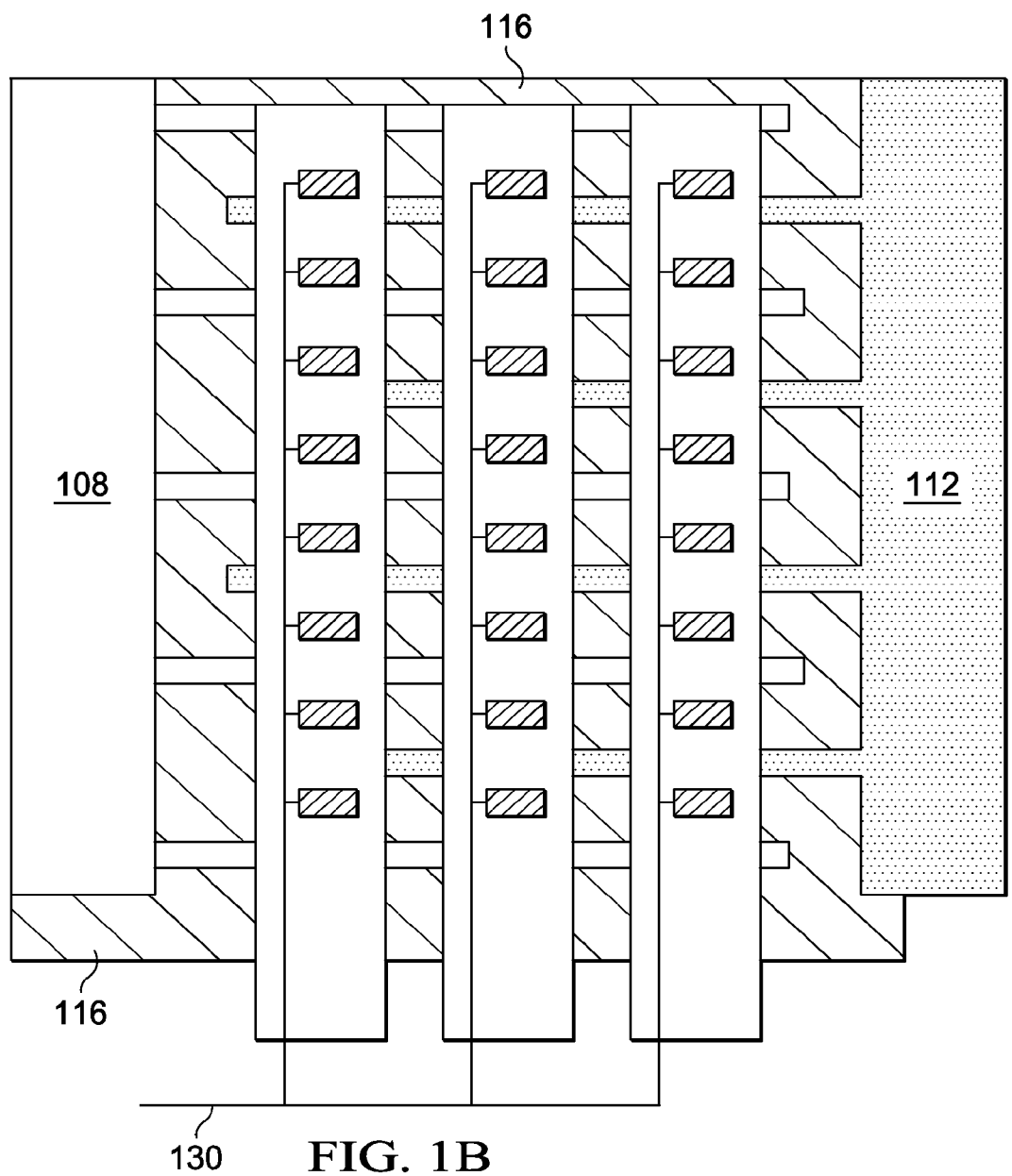

One way to improve the overall performance of the FET 100 is to employ an interdigitated, or "comb," structure, typically by connecting several FETs 100 in parallel, as depicted in FIGS. 1A and 1B. In such a configuration, a single source contact 108A and a single drain contact 112A are connected to the source region 108 and drain region 112, respectively, on each device. Each FET 100 uses the same gate electrode 116. This configuration typically reduces the resistance of the gate electrode 116, thereby reducing its time constant and improving frequency response.

The example interdigitated structure shown in FIG. 1A includes several separate source and drain regions 108, 112 with the common gate electrode 116 placed substantially between them. Single source and drain contacts 108A, 112A are connected to each source region 108 and drain region 112, respectively, typically at contact locations 130, by bridging the gate electrode 116. Another example of an interdigitated structure is shown in FIG. 1B and includes parallel FETs 100 that share a single, elongated source region 108 and a single, elongated drain region 112. These elongated regions are offset relative to each other. The gate electrode 116 is disposed, typically in a serpentine pattern, substantially within the area defined by the offset. Overlaying the gate electrode 116 are several bridging contacts, typically at contact locations 130, that help reduce its resistance, as discussed above.

The addition of the various material layers described above may be accomplished using any conventional deposition method (e.g., chemical vapor deposition ("CVD") or molecular beam epitaxy ("MBE")), and the method may be plasma-assisted. When these layers are added, a region that supplies excess carriers to the channel 110 may be disposed substantially adjacent to the latter. This region generally includes a p- or n-type impurity (i.e., dopant) that acts as a source of the excess carriers (holes or electrons, respectively). The presence of these excess carriers typically improves FET performance. The impurity can also be introduced after the addition of the layers using, for example, ion implantation.

An impurity gradient 120A, 120B (collectively, "120") characterizes the channel 110 and the substrate 102, as well as the isolation well 104. Axis 122 represents the impurity concentration, typically in units of cm$^{-3}$. Axis 124 corresponds to the location in the FET 100. Axis 124 is aligned with the FET 100 to illustrate a typical impurity profile, meaning that the impurity concentration at any point in the FET 100 can be ascertained as a function of location.

The impurity gradient 120 is shown in FIG. 1 in an expanded view that, for clarity, differs in scale compared to the remainder of (unscaled) FIG. 1. A distal zone of the channel 110 is the furthest part of the channel 110 that is located away from the substrate 102. The distal zone typically includes at least about fifty Angstroms of the furthest part of the channel 110. That is, the distal zone is at least about fifty Angstroms thick. The distal zone corresponds to that portion of the impurity gradient 120 between boundaries 126, 128 (expanded for clarity). Within the distal zone of the channel 110, the impurity gradient 120 has a value substantially equal to zero. The depicted shape of the impurity gradient 120 is not intended to be limiting, and the impurity gradient 120 can also have a value substantially equal to zero before reaching the boundary 126. For example, impurity gradient 120A may describe a profile of a p-type (e.g., boron) or n-type (e.g., phosphorous or arsenic) dopant introduced in the substrate 102. On the other hand, impurity gradient 120B may, for example, describe a substantially constant concentration of Ge, or Si, or both, in the substrate 102 that takes on a desired value (e.g., a reduced value) in the channel 110. Stated differently, the impurity gradient 120 may describe the concentration of any species in the substrate 102, including the substrate species itself, at any point in the FET 100.

As described above, an alternative embodiment includes disposing a relaxed SiGe "cap" layer between the channel 110 and the gate dielectric 114. The resulting structure is termed a buried strained channel FET, and it has many performance advantages over the surface strained channel FET depicted in FIG. 1.

Figure 2:
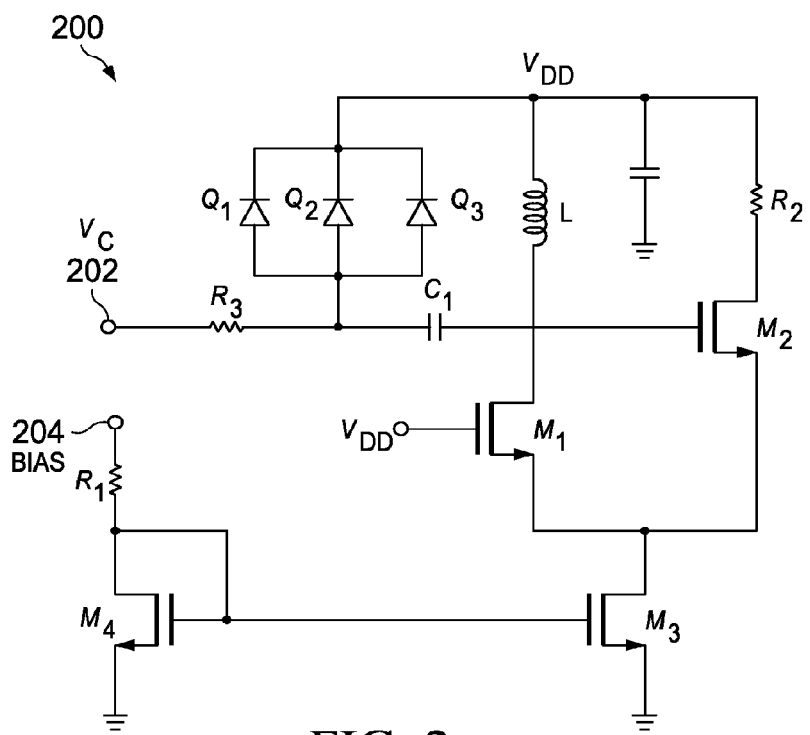
FIG. 2 is a schematic that depicts a VCO in accordance with an embodiment of the invention.

In brief overview, FIG. 2 is schematic that depicts a VCO 200 in accordance with an embodiment of the invention. The VCO 200 includes several FETs (denoted by reference designators beginning with "M") and varactor diodes (denoted by reference designators beginning with "Q"). Also included are impedance elements (see reference designators beginning with "R"), that are resistive at the frequency or frequencies of interest.

The basic design of a VCO is well known, and additional details are available in, e.g., *Radio-Frequency Microelectronic Circuits for Telecommunication Applications*, Y. Papananos, Kluwer Academic Publishers, 1999, p. 188 et seq., and *Analysis and Design of Analog Integrated Circuits*, P. Gray & R. Meyer, John Wiley & Sons, 1984, pp. 628 et seq. Briefly, in VCO 200, output 202 has a frequency that is a function of bias voltage 204. The connection between the gate of FET M2 and drain of FET M1 provides positive feedback to sustain oscillation. FETs M3 and M4 are part of the biasing network, and inductor L and capacitor C1 form a tuned L-C circuit. Varactor diodes Q1 through Q3 are typically bipolar structures, meaning a single-chip VCO may be fabricated using a BiCMOS process.

FETs M1 through M4 are fabricated with channels that include one or more strained channel layers disposed on one or more planarized substrate layers. The channels may be buried below the device surface, or may be surface channels, both as described above. Consequently, the FETs M1 through M4 exhibit improved noise figures, thereby reducing the overall phase noise of the entire VCO 200.

Figure 3:
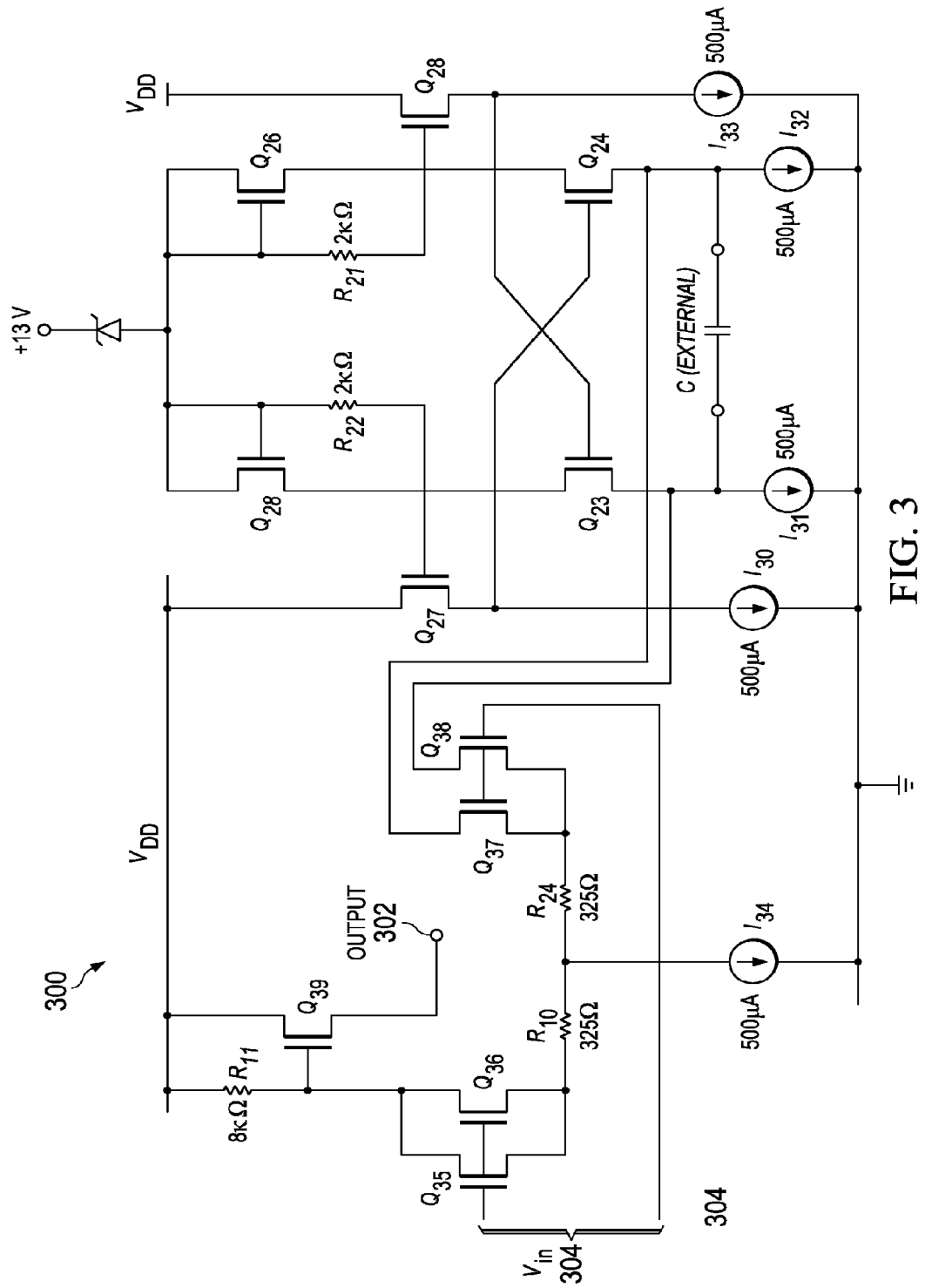
FIG. 3 is a schematic that depicts an alternative VCO design.

Other VCO designs that incorporate FETs having the strained layer on planarized layer structure are possible including, for example, VCO 300 depicted in FIG. 3. Briefly, VCO 300 includes an input stage based on a differential amplifier (generally, FETs Q35 through Q38). The VCO 300 also includes a multivibrator circuit (generally, FETs Q23 and Q24) that has a free running frequency that is inversely proportional to the capacitance C. By using FETs that have one or more strained layers, the overall performance of VCO 300 is enhanced.

Figure 4:
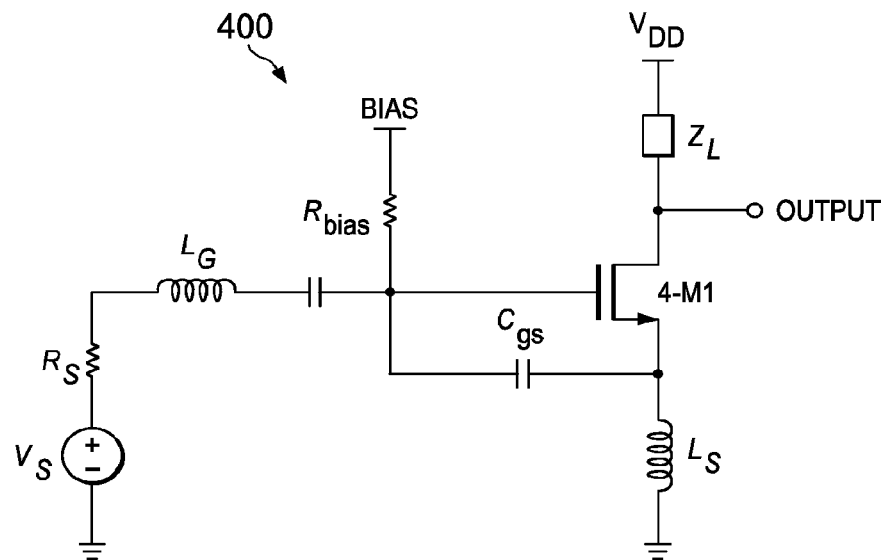
FIG. 4 is a schematic that depicts a LNA in accordance with an embodiment of the invention.

In another embodiment depicted in FIG. 4 in simplified form, an LNA 400 is fabricated using a FET 4-M1 that includes one or more strained channel layers disposed on one or more planarized substrate layers. LNA 400 includes a biasing network Rbias. Inductive elements LG, LS provide input matching. The overall noise figure for the LNA 400 as a function of frequency ("ω") is:

$$NF_{LNA} \approx 1 + \frac{8\omega^2 C_{gs}^2 R_S}{3g_m} \qquad \text{(Equation 7)}$$

Accordingly, as the transconductance increases, the noise figure of the LNA 400 decreases. As discussed above in connection with equation (2), FETs fabricated using one or more strained Si layers have, for a given source-drain bias, greater drain current, and therefore greater transconductance, compared to conventional FETs. Consequently, LNA 400 has improved noise performance compared to LNAs fabricated using conventional FETs.

Figure 5:
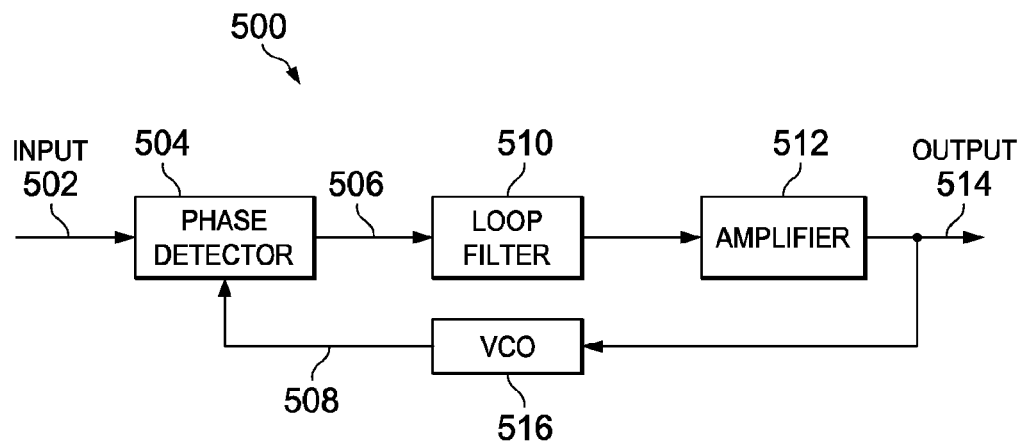
FIG. 5 is a block diagram that depicts a PLL structure.

FIG. 5 is a block diagram that shows a basic PLL 500. As is well known, when the PLL 500 is "locked" on an input signal 502 having a particular frequency, a VCO 516 oscillates at that frequency. A phase detector 504 produces a signal 506 that is proportional to the phase difference between the input signal 502 and the VCO output signal 508. The signal 506 is passed through a loop filter 510, then to amplifier 512, and becomes output signal 514. Output signal 514 is also fed back to control the VCO 516.

In various embodiments of the invention, alternative VCOs 200, 300, depicted in FIGS. 2 and 3, respectively, are used in place of the VCO 516. In other embodiments, LNA 400 is used as the amplifier 512. In each case, the improved performance of VCOs 200, 300, and LNA 400, as described above, results in a PLL 500 that exhibits similar operational performance enhancements (e.g., improved transconductance, noise figure, etc.).

Figure 6:
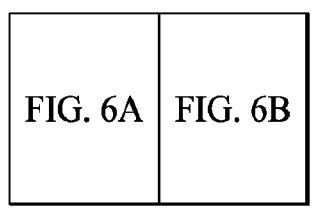
FIG. 6 is a schematic that depicts a PLL in accordance with an embodiment of the invention.
Figure 6A:
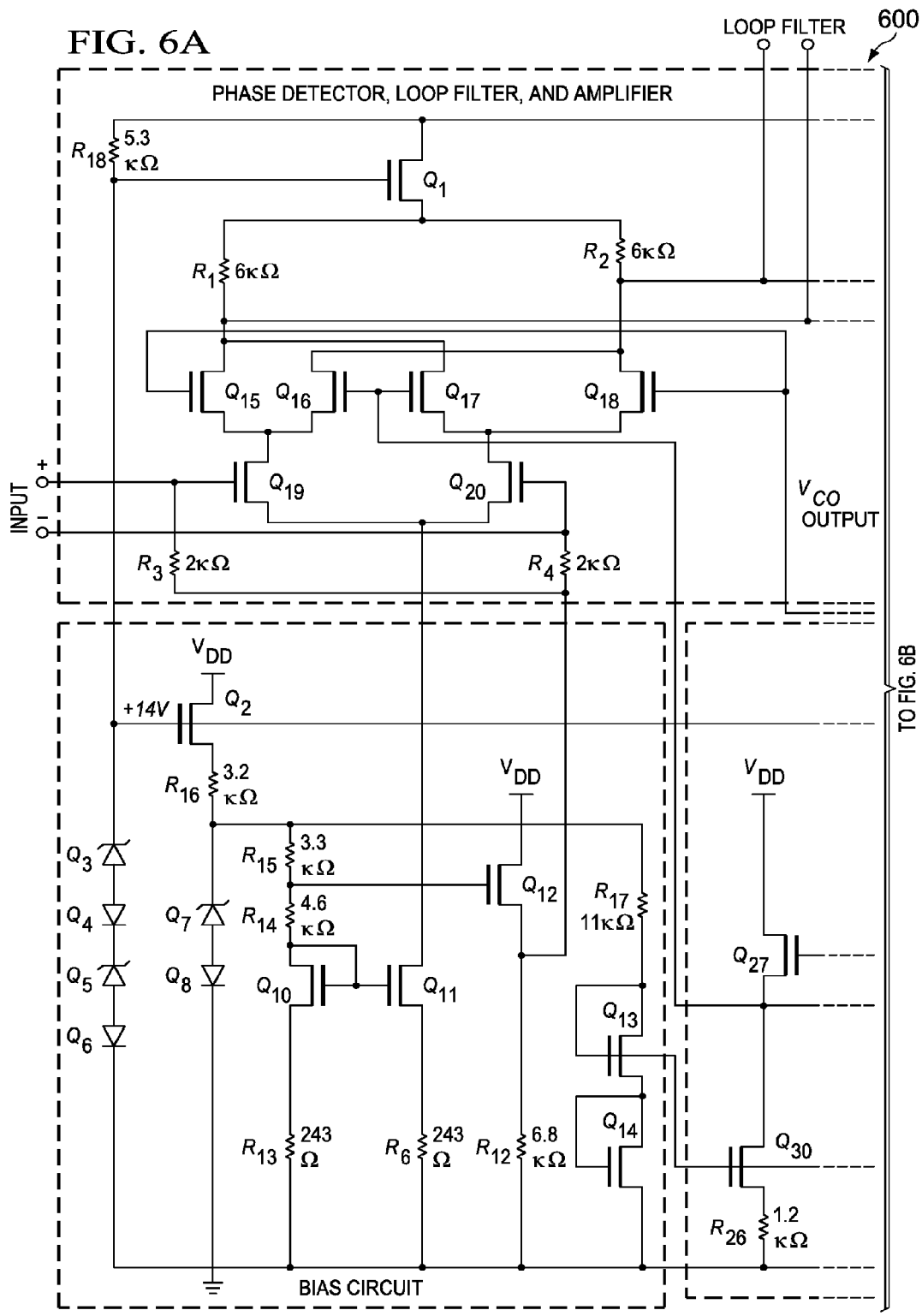
Figure 6B:
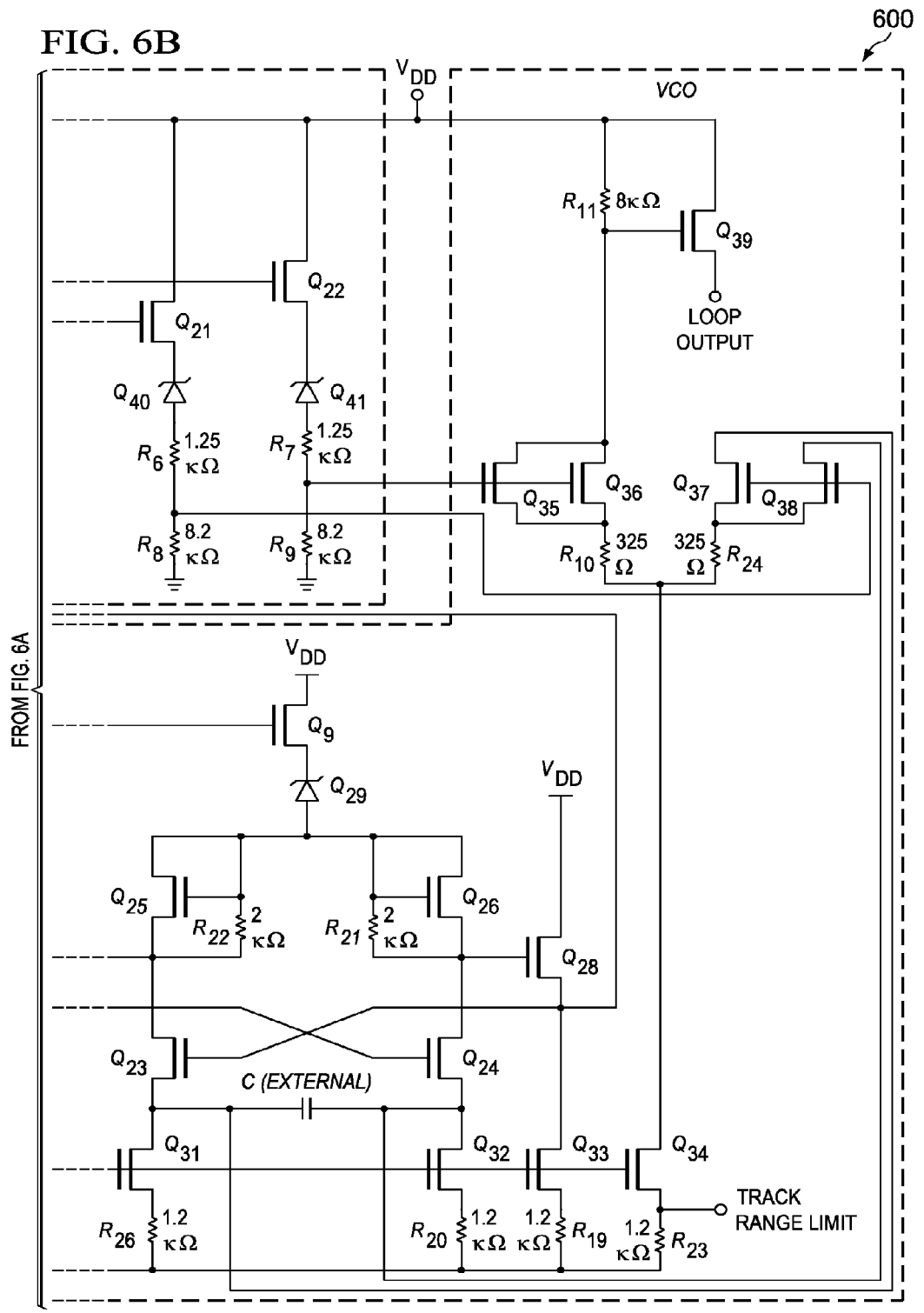

FIG. 6 depicts an alternative PLL design 600. PLL design 600 uses FETs fabricated with channels that include one or more strained channel layers disposed on one or more planarized substrate layers in many, if not all, instances in the PLL 500. This further enhances the overall operational performance of the PLL 500.

From the foregoing, it will be appreciated that the RF circuits provided by the invention afford improved operational performance. Certain operational problems resulting from the limitations inherent in conventional devices used in conventional circuits are largely eliminated.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes which come within the meaning and range of equivalency of the claims are therefore intended to be embraced therein.

What is claimed is:

1. A semiconductor structure comprising:
a first source region and a second source region in a substrate, the first source region and the second source region being electrically coupled together;
a first drain region and a second drain region in the substrate, the first drain region and the second drain region being electrically coupled together, the first drain region being disposed between the first source region and the second source region, and the second source region being disposed between the first drain region and the second drain region; and
a first channel region, a second channel region, and a third channel region, the first channel region being disposed between the first source region and the first drain region, the second channel region being disposed between the first drain region and the second source region, the third channel region being disposed between the second source region and the second drain region, each of the first channel region, the second channel region, and the third channel region comprising a strained channel layer disposed on the substrate thereby defining an interface therebetween, the strained channel layer having a proximate region proximate the interface and a distal region away from the interface, wherein the substrate has an impurity with a first concentration, the proximate region has the impurity with a second concentration, the distal region has a third concentration of the impurity substantially equal to zero throughout a thickness of at least 50 Angstroms of the strained channel layer in the distal region, a continuously decreasing concentration of the impurity being from the second concentration in the proximate region to the third concentration in the distal region.

2. The semiconductor structure of claim 1, wherein the substrate comprises compositionally graded SiGe and a relaxed SiGe layer over the compositionally graded SiGe.

3. The semiconductor structure of claim 1, wherein the impurity is germanium or silicon.

4. The semiconductor structure of claim 1 further comprising:
a first gate dielectric over the first channel region and a first gate electrode over the first gate dielectric;
a second gate dielectric over the second channel region and a second gate electrode over the second gate dielectric; and
a third gate dielectric over the third channel region and a third gate electrode over the third gate dielectric.

5. The semiconductor structure of claim 1 further comprising a relaxed cap layer over each of the strained channel layer of the first channel region, the second channel region, and the third channel region.

6. The semiconductor structure of claim 1, wherein the substrate comprises a planarized surface at the interface.

7. A circuit comprising:
at least one field effect transistor (FET) operable to have a radio-frequency (RF) signal applied thereto, the at least one FET comprising:
a channel region including at least one strained channel layer disposed on a substrate, an interface being between the substrate and the strained channel layer, the at least one strained channel layer having a proximal zone proximate the interface and a distal zone away from the interface, wherein the substrate has a first concentration of an impurity, the proximal zone has a second concentration of the impurity, and the distal zone has a third concentration of the impurity, the first concentration being greater than the third concentration, the third concentration being substantially equal to zero, a continuously decreasing concentration of the impurity being from the second concentration in the proximal zone to the third concentration in the distal zone; and
a gate electrode over the channel region.

8. The circuit of claim 7, wherein the impurity is silicon or germanium.

9. The circuit of claim 7, wherein the impurity is an n-type dopant or a p-type dopant.

10. The circuit of claim 7, wherein the at least one FET further comprises a relaxed cap layer over the strained channel layer.

11. The circuit of claim 7, wherein the at least one FET is a component of a voltage controlled oscillator, a low noise amplifier, or a phase locked loop.

12. The circuit of claim 7, wherein the distal zone has a thickness of at least about fifty Angstroms of the at least one strained channel layer, the third concentration being throughout the thickness.

13. A voltage controlled oscillator circuit, comprising:
an output terminal for outputting an oscillating signal of a radio frequency proportional to a bias voltage;
a tuned inductor capacitor (LC) circuit coupled to the output terminal;
a first FET having a drain coupled to the tuned LC circuit, a gate coupled to a positive supply voltage node, and a source coupled to a common source node;
a second FET having a gate coupled to the drain of the first FET and the tuned LC circuit, a drain coupled to a positive supply voltage node and a source coupled to the common source node; and
a third FET and a fourth FET coupled to provide a bias voltage at the common source node, responsive to the bias voltage;
wherein at least one of the first, second, third and fourth FETs comprises:
a channel region including at least one strained channel layer disposed on a substrate, an interface being between the substrate and the strained channel layer, the at least one strained channel layer having a proximal zone proximate the interface and a distal zone away from the interface, wherein the substrate has a first concentration of an impurity, the proximal zone has a second concentration of the impurity, and the distal zone has a third concentration of the impurity, the first concentration and the second concentration each being greater than the third concentration, the third concentration being substantially equal to zero; and
a gate electrode overlying a portion of the channel region.

14. The voltage controlled oscillator circuit of claim 13, wherein at least the first and second FETs each comprise:
at least one of the channel region; and
at least one of the gate electrode.

15. The voltage controlled oscillator circuit of claim 13, wherein each of the first, second, third and fourth FETs comprises:
at least one of the channel region; and
at least one of the gate electrode.

16. The voltage controlled oscillator circuit of claim 13, wherein the substrate further comprises compositionally graded SiGe and a relaxed SiGe layer overlying the compositionally graded SiGe.

17. The voltage controlled oscillator circuit of claim 13, wherein the at least one of the first, second, third and fourth FETs further comprises a gate dielectric layer overlying the strained channel layer.

18. The voltage controlled oscillator circuit of claim 17, further comprising a SiGe cap layer disposed between the strained channel layer and the gate dielectric layer.

19. The voltage controlled oscillator circuit of claim 13, wherein the impurity is silicon or germanium.

* * * * *